(12) United States Patent
Funabashi

(10) Patent No.: US 8,431,913 B2
(45) Date of Patent: Apr. 30, 2013

(54) CHARGED PARTICLE BEAM PROCESSING METHOD

(75) Inventor: Katsuhiro Funabashi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 136 days.

(21) Appl. No.: 12/706,435

(22) Filed: Feb. 16, 2010

(65) Prior Publication Data

US 2010/0213393 A1    Aug. 26, 2010

(30) Foreign Application Priority Data

Feb. 23, 2009  (JP) ................................. 2009-038814

(51) Int. Cl.
*H01J 37/305*   (2006.01)
*H01J 37/02*    (2006.01)

(52) U.S. Cl.
USPC .................................. 250/492.23; 250/492.3

(58) Field of Classification Search ...... 250/492.1–492.3
See application file for complete search history.

(56) References Cited

U.S. PATENT DOCUMENTS

| | | | |
|---|---|---|---|
| 7,109,487 B2 * | 9/2006 | Kienle et al. | 250/311 |
| 7,115,511 B2 * | 10/2006 | Hautala | 438/689 |
| 7,355,188 B2 * | 4/2008 | Olson et al. | 250/492.21 |
| 7,676,904 B2 * | 3/2010 | Chau et al. | 29/603.12 |
| 7,750,323 B1 * | 7/2010 | Wan et al. | 250/492.21 |
| 2004/0262516 A1 | 12/2004 | Motoi et al. | |
| 2006/0017016 A1 * | 1/2006 | Tappel | 250/492.21 |
| 2006/0278611 A1 * | 12/2006 | Sato et al. | 216/66 |
| 2009/0014648 A1 | 1/2009 | Zeile et al. | |
| 2009/0084759 A1 * | 4/2009 | MacCrimmon et al. | 216/84 |
| 2010/0051805 A1 * | 3/2010 | Rahman et al. | 250/307 |
| 2010/0081096 A1 * | 4/2010 | Itai et al. | 430/325 |
| 2010/0176296 A1 * | 7/2010 | Kaito et al. | 250/307 |
| 2010/0207041 A1 * | 8/2010 | Sato et al. | 250/492.3 |
| 2010/0288924 A1 * | 11/2010 | Kaito et al. | 250/307 |

FOREIGN PATENT DOCUMENTS

| | | |
|---|---|---|
| DE | 10 2007 058 103 A1 | 6/2008 |
| JP | 04373125 A | 12/1992 |
| JP | 2007098438 A | 4/2007 |
| WO | WO 2009020151 A1 * | 2/2009 |

OTHER PUBLICATIONS

European Search Report dated May 14, 2012, in related European Patent Application No. 10153938.5.

* cited by examiner

*Primary Examiner* — David A Vanore
*Assistant Examiner* — Wyatt Stoffa
(74) *Attorney, Agent, or Firm* — Fitzpatrick, Cella, Harper & Scinto

(57) ABSTRACT

In a method for processing a surface of an object by radiating a plurality of charged particle beams to the surface of the object while moving the charged particle beams relative to the surface of the object, steps includes radiating a first charged particle beam and a second charged particle beam simultaneously to the surface of an object, and controlling a relative speed of the movement of the first charged particle beam to the surface of the object to correct the shape of the surface of the object with the first charged particle beam. In addition, the second charged particle beam is controlled according to a variation in the relative speed of the movement of the first charged particle beam so as to make a number of particles of the second charged particle beam that reach a unit area of the surface of the object constant, thereby smoothing the surface of the object.

8 Claims, 4 Drawing Sheets

CHARGED PARTICLE BEAM PROCESSING METHOD

BACKGROUND OF THE INVENTION

1. Field of the Invention

The present invention relates to a charged particle beam processing method for processing with high accuracy the surface of an object, such as an optical element or a mold for forming the optical element, using charged particle beams.

2. Description of the Related Art

To form an optical validity region with desired optical characteristics on the surface of an optical element, the shape or roughness of the optical validity region should be processed with more than a certain degree of accuracy. The shape, in this invention, means a residual shape in a space wavelength band of equal to or more than 1 mm, and the roughness means a residual shape in a space wavelength band of equal to or less than 1 µm. Since the charged particle beam processing can be performed while being electrically controlled, it has high controllability. In addition, since the amount of processing is determined by the number of particles reaching the surface of the object, it is possible to process an object with high accuracy. Therefore, the charged particle beam processing method is used to process the surface of an object, such as an optical element.

In a shape correcting process using the charged particle beam processing method, first, the shape of the surface of an object is measured, and a residual shape is calculated from the difference between the measured shape and the design shape. The residual shape is removed as a target processed shape to process the surface of the object into the design shape. The number of particles of the charged particle beam that reach the surface of the object is controlled according to positions such that the target processed shape is processed. The number of particles of the charged particle beam that reach a unit area of the surface of the object (the number of particles that reach a unit area) can be represented by the product of the radiation time and the amount of current of the charged particle beam, on the condition that the valence of the charged particle is known. Therefore, a predetermined charged particle beam with a diameter that is smaller than that of the surface of an object and with a constant current is radiated to the surface of the object while the beam being moved relative to the surface of the object, and the radiation time is controlled by the relative movement in which a residence time distribution corresponding to a target processed shape. In this way, a shape correcting process is performed (see Japanese Patent Application Laid-Open No. 2007-098438).

When the roughness after the shape correcting process is performed is larger than a desired roughness, a smoothing process is necessary to be additionally performed. Examples of a smoothing processing method using a charged particle beam include: a processing method using a low-energy charged particle; a processing method using a charged particle beam that is obliquely incident; and a processing method after a film is formed. In each processing method, the smoothing process, in which the roughness is reduced without changing the shape, is controlled such that the number of particles of the charged particle beam that reach a unit area of the surface of the object is constant, and the entire processing region is uniformly processed.

In addition, when charged particle beam processing is performed plural times, plural charged particle beams are radiated to the surface of an object at the same time and processing is performed in parallel, thereby reducing the processing time (see Japanese Patent Application Laid-Open No. H04-373125).

In the method disclosed in Japanese Patent Application Laid-Open No. H04-373125, a portion of the object requiring finish processing is limited. Therefore, even when roughness processing and finish processing are independently performed, it is possible to reduce the processing time.

However, in the method disclosed in Japanese Patent Application Laid-Open No. 2007-098438 in which the smoothing process is performed after the shape correcting process, it is most efficient to radiate each of the charged particle beams to an object substantially at the same time by the same movement relative to the object. However, the method in which plural charged particle beams are simultaneously radiated to the surface of the object with the same relative movement and the shape correcting process and the smoothing process are performed in parallel to reduce the processing time has the following problems.

In the shape correcting process and the smoothing process performed on the surface of the object, different numbers of particles are controlled to reach a unit area. That is, in the structure in which the number of particles that reach a unit area is controlled by the relative movement between the charged particle beam and the surface of the object, the shape correcting process and the smoothing process performed on the surface of the object need to have different relative movements between the charged particle beam and the surface of the object. Therefore, it is difficult to simultaneously radiate plural charged particle beams to the surface of the object and perform the shape correcting process and the smoothing process on the surface of the object in parallel while moving the charged particle beams relative to the surface of the object.

SUMMARY OF THE INVENTION

An object of the invention is to provide a charged particle beam processing method capable of performing a shape correcting process and a smoothing process in parallel with plural charged particle beams to reduce the processing time.

To achieve the object, according to an aspect of the invention, there is provided a method for radiating plural charged particle beams to a surface of an object at the same time while moving the charged particle beams relative to the surface of the object, thereby processing the surface of the object. The method includes: controlling the speed of the relative movement to correct the shape of the surface of the object with a first charged particle beam among the plurality of charged particle beams; and controlling a second charged particle beam among the plurality of charged particle beams according to a variation in the speed of the relative movement such that the number of particles of the second charged particle beam that reach a unit area of the surface of the object is maintained to be constant, thereby smoothing the surface of the object.

It is possible to simultaneously perform plural processing operations which are divided due to a difference in the distribution of the number of particles that reach a unit area on the surface of the object by controlling, according to a variation in the speed of the relative movement, the radiation time (pulse width) of the charged particle beam or the amount of current. Therefore, it is possible to reduce the processing time.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

(First Embodiment)

Figure 1:
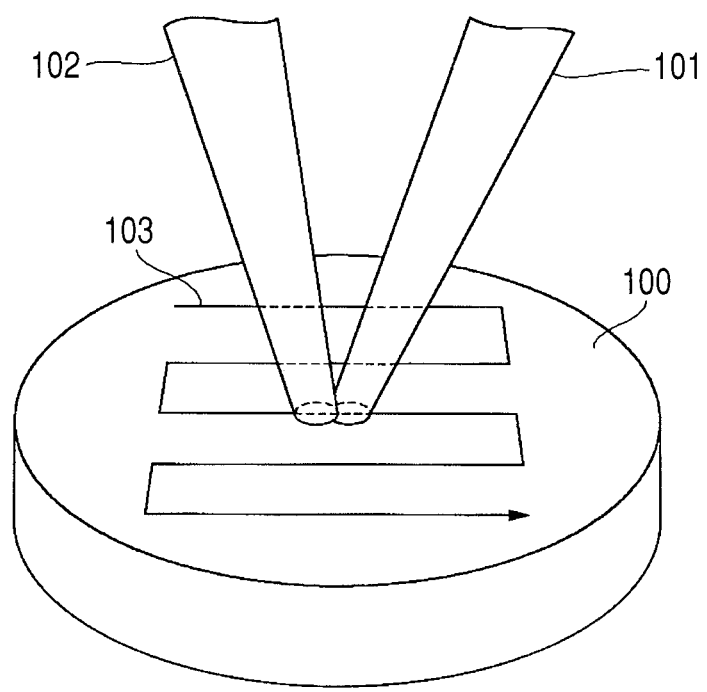
FIG. 1 is a diagram illustrating an ion beam processing method according to a first embodiment of the invention.

FIG. 1 is a diagram illustrating an example of a processing apparatus used in a method for processing an object using a charged particle beam according to a first embodiment of the invention.

In FIG. 1, a surface 100 of an object is shown.

A first charged particle beam 101 is a charged particle beam for a shape correcting process. The charged particle beam 101 for a shape correcting process is adjusted by an adjusting unit (not shown) such that a charged particle beam with an energy selected from, for example, 500 eV to 100 keV is radiated to the surface of the object. In addition, the charged particle beam 101 for a shape correcting process is adjusted by an adjusting unit (not shown) such that a charged particle beam with a radiation spot diameter of, for example, 1 mm to 50 mm is radiated to the surface of the object.

A second charged particle beam 102 is a charged particle beam for a smoothing process. A charged particle beam with a beam diameter that is equal to or more than that of the charged particle beam 101 for a shape correcting process is radiated to the surface of the object that is processed by the charged particle beam 101 for a shape correcting process to smooth the surface of the object. The charged particle beam 102 for a smoothing process is adjusted by an adjusting unit (not shown) such that energy capable of performing smoothing, for example, an energy selected from 20 eV to 500 eV is applied to the surface of the object. The charged particle beam 102 for a smoothing process is adjusted by an adjusting unit (not shown) such that a charged particle beam with a radiation spot diameter of 1 mm to 100 mm is radiated to the surface of the object.

The charged particle beam 101 for a shape correcting process and the charged particle beam 102 for a smoothing process are radiated to the surface of the object at the same time. Then, a moving unit (not shown) moves the charged particle beam 101 for a shape correcting process and/or the surface of the object relatively to each other. At the same time, a moving unit (not shown) moves the charged particle beam 102 for a smoothing process relative to the surface of the object such that the surface of the object processed by the charged particle beam 101 for a shape correcting process is processed, similar to the charged particle beam 101 for a shape correcting process. The relative movement is an operation for uniformly scanning a desired processing region of the surface 100 of the object with the charged particle beam 101 for a shape correcting process and the charged particle beam 102 for a smoothing process. As shown in FIG. 1, the trajectory of the charged particle beams 101 and 102 radiated to the surface 100 of the object by the relative movement may be a raster scan trajectory 103, a spiral scan trajectory, or a combination of spiral scanning and raster scanning.

Next, a method for processing an object using a charged particle beam according to an embodiment of the invention will be described.

First, the shape of an object is measured, and a residual shape is obtained from the difference between the measured data and the design shape. The energy and the radiation spot diameter of the first charged particle beam for a shape correcting process are determined based on the residual shape. A radiation time at each point on the surface of the object is calculated from the energy, the total amount of current, and the radiation spot diameter of the selected charged particle beam, and the speed of the relative movement is controlled such that a residence time distribution is the same as the calculated radiation time distribution. In this way, the residual shape is removed and the shape of the surface of the object is corrected.

In addition, the energy and the radiation spot of the second charged particle beam for a smoothing process are determined, and the distribution of the number of particles that reach a unit area of the surface of the object which enables the surface of the object to be smoothed is calculated. Then, a control process of changing the pulse width of the charged particle beam or the amount of current is performed according to a variation in the speed of the relative movement such that the calculated number of particles that reach a unit area is maintained to be constant.

During processing, all of the charged particle beams are moved relative to the surface of the object in the same way to be uniformly radiated to the surface of the object.

Since all of charged particle beams have the same residence time distribution, the second charged particle beam for a smoothing process with a low energy of 20 to 500 eV, by radiation time pulse control or current variable control, makes the distribution of the number of particles that reach a unit area uniform.

The center of the second charged particle beam for a smoothing process at a radiation position is disposed on the rear side of the first charged particle beam for a shape correcting process in the relative movement direction.

As such, it is possible to perform the shape correcting process and the smoothing process on the surface of the object in parallel by simultaneously radiating each of plural charged particle beams to the surface of the object while moving the charged particle beams relative to the surface of the object by the same movement. Therefore, it is possible to improve the efficiency of processing and reduce the processing time.

A detailed control method will be described with reference to FIGS. 2A, 2B, and 2C.

Figure 2A:
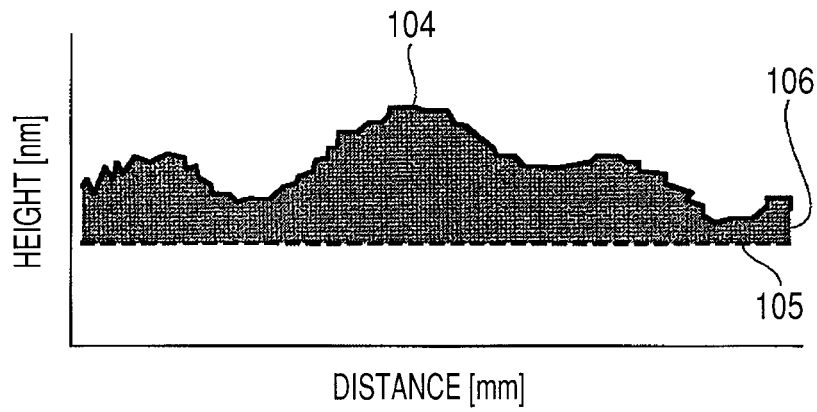
FIGS. 2A, 2B, and 2C are graphs illustrating a method for controlling a shape correcting process according to the first embodiment.
Figure 2B:
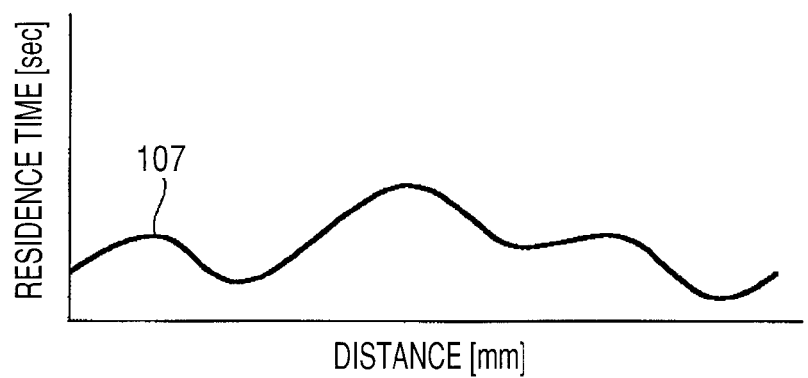
Figure 2C:
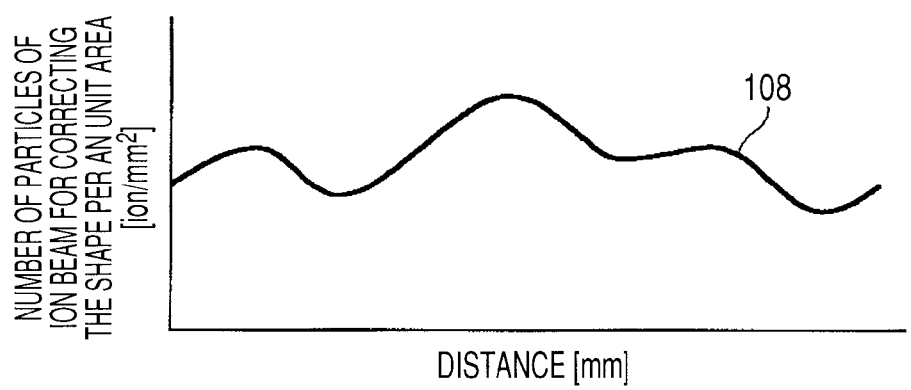

FIGS. 2A, 2B, and 2C are diagrams illustrating a method for controlling processing using the charged particle beam 101 for a shape correcting process. FIG. 2A shows an object surface shape 104 and an object design shape 105 in a cross section along an arbitrary line of the raster scan trajectory 103 on the surface 100 of the object. The difference between the object surface shape 104 and the design shape 105 is a residual shape 106. FIG. 2B shows a residence time distribution 107 of the charged particle beams at each point on the surface 100 of the object, and FIG. 2C shows a distribution 108 of the number of particles that reach a unit area in the charged particle beam 101 for a shape correcting process.

First, the shape of the surface 100 of the object is accurately measured by an optical interferometer with the measurement accuracy of a sub-nanometer order, and the measured shape data is the object surface shape 104. The residual shape 106 is calculated from the difference between the object surface shape 104 and the design shape 105. The residual shape 106 is used as processing shape data. The residence time distribution 107, which is a beam radiation time at each point, is calculated from, for example, the processing rate and the radiation spot diameter when an object is processed based on the processing shape data, the energy of the charged particle beam, and the total amount of current. The total amount of current of the charged particle beam 101 for a shape correcting process is maintained to be constant and the distribution 108 of the number of particles that reach a unit area in the charged particle beam 101 for a shape correcting process is controlled by the residence time distribution 107. The distribution 108 of the number of particles that reach a unit area in the charged particle beam 101 for a shape correcting process depends on the residual shape 106. The number of particles that reach a unit area is large at a position where the amount of error is large, and the number of particles that reach a unit area is small at a position where the amount of error is small. The processing rate calculated from an actual object processing experiment is used. In this way, it is possible to correct the shape of an object with high accuracy.

Figure 3A:
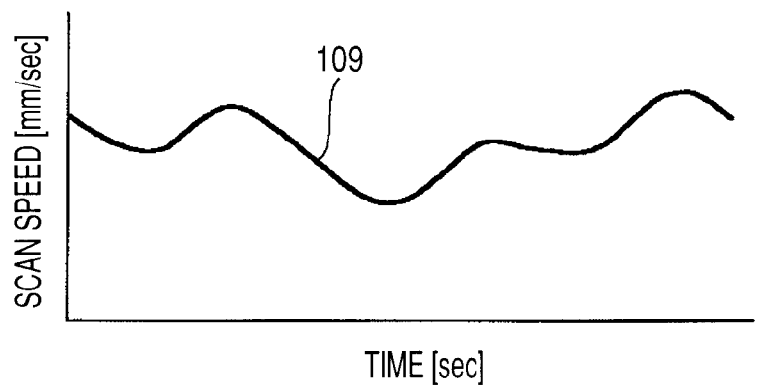
FIGS. 3A, 3B, and 3C are graphs illustrating a method for controlling a smoothing process according to the first embodiment.
Figure 3B:
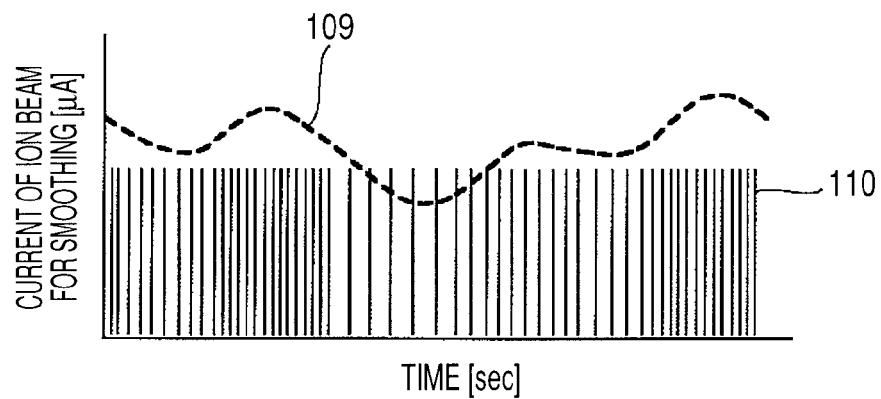
Figure 3C:
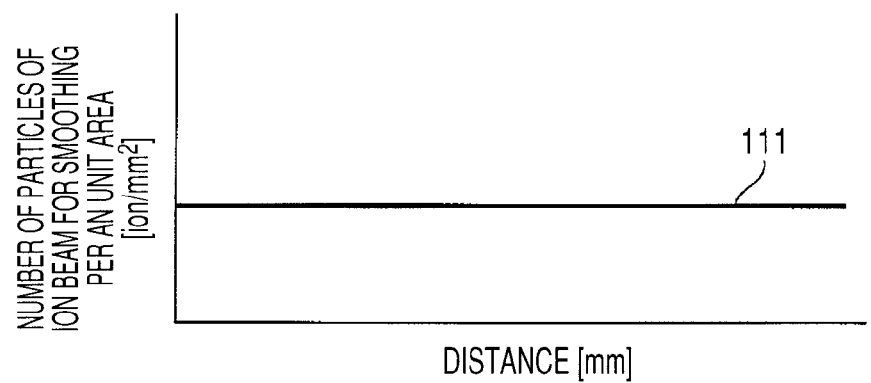

Since all of the charged particle beams are moved relative to the surface 100 of the object by the same movement, the residence time distribution 107 of the charged particle beam 101 for a shape correcting process is the same as that of the charged particle beam 102 for a smoothing process. FIGS. 3A, 3B, and 3C are diagrams illustrating a method for making a distribution 111 of the number of particles that reach a unit area in the charged particle beam 102 for a smoothing process uniform. FIG. 3A is a graph obtained by converting the residence time distribution 107 shown in FIG. 2B. In FIG. 3A, the horizontal axis indicates time, and the vertical axis indicates a scanning speed variation 109. FIG. 3B shows a radiation pulse 110 of the charged particle beam 102 for a smoothing process, and the pulse length is 1 msec. The charged particle beam radiation time is changed to a pulse by connecting a high-voltage power supply to a shutter electrode of a charged particle beam gun for smoothing and applying a high pulse voltage of, for example, 10 kV from the high-voltage power supply to the shutter electrode under the control of a control unit of a charged particle beam processing apparatus.

When the charged particle beam is changed to a pulse, the radiation time at each point on the surface 100 of the object is the product of a pulse length of 1 msec and the number of pulses. That is, the number of particles that reach a unit area is controlled to be constant by performing a control such that the total amount of current of the charged particle beam 102 for a smoothing process is maintained to be constant and the number of pulses at each point on the surface 100 of the object is constant. That is, as shown in FIG. 3B, when the scanning speed is high, the number of pulses becomes large, and when scanning speed is low, the number of pulses becomes small. As a result, as shown in FIG. 3C, the distribution 111 of the number of particles of the object in the charged particle beam 102 for a smoothing process that reach a unit area on the surface 100 is uniform (constant).

The total amount of current of the charged particle beam 102 for a smoothing process is set such that the desired number of particles that reach a unit area is obtained at the highest scanning speed and the largest number of pulses.

In this way, it is possible to perform the shape correcting process and the smoothing process at the same time and thus significantly reduce the processing time. A mechanical shutter as well as an electrical shutter using a shutter electrode may be used to change the charged particle beam into a pulse.

(Second Embodiment)

A second embodiment differs from the first embodiment in a method for performing variable control on the charged particle beam for a smoothing process. The charged particle beam for a shape correcting process is the same as that in the first embodiment and a description thereof will not be repeated.

In the present embodiment, similar to the first embodiment, the charged particle beam for a shape correcting process and the charged particle beam for a smoothing process are radiated to the surface of an object at the same time and are moved relative to the surface of the object by the same movement. The charged particle beams pass through the raster scan trajectory by the relative movement.

In the present embodiment, an ion beam gun is used to emit the charged particle beam for a smoothing process, and an ion source is a microwave type. A microwave output controller of an ion beam processing apparatus can control the output of a microwave incident into a plasma chamber to change plasma density. In this way, it is possible to control the total amount of current of the ion beam.

First, the shape of the surface of an object is accurately measured, and a residual shape is calculated from the difference between the measured shape data and the design shape. The residual shape is used as processing shape data. A residence time distribution is calculated from the processing shape data, and variable control is performed on the scanning speed of the charged particle beam for a shape correcting process. In this way, the shape correcting process is performed.

Figure 4A:
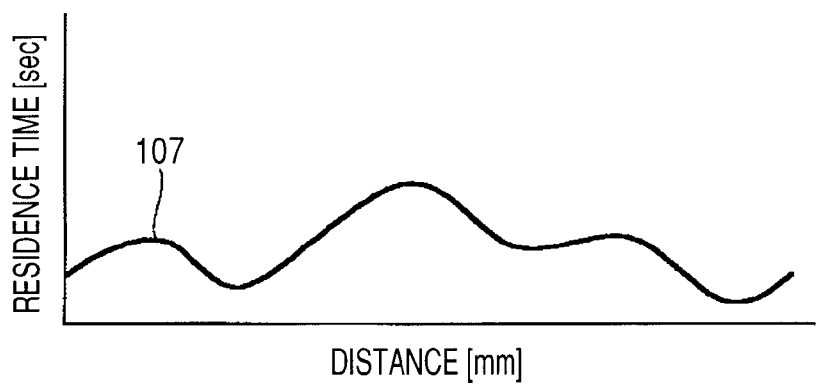
FIGS. 4A, 4B, and 4C are graphs illustrating a method for controlling a smoothing process according to a second embodiment of the invention.
Figure 4B:
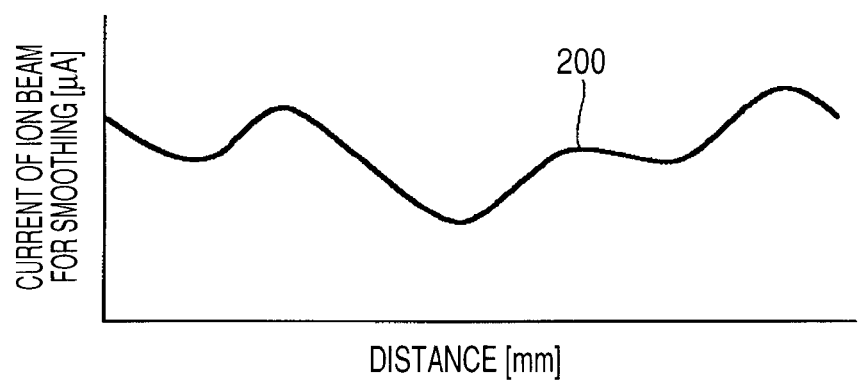
Figure 4C:
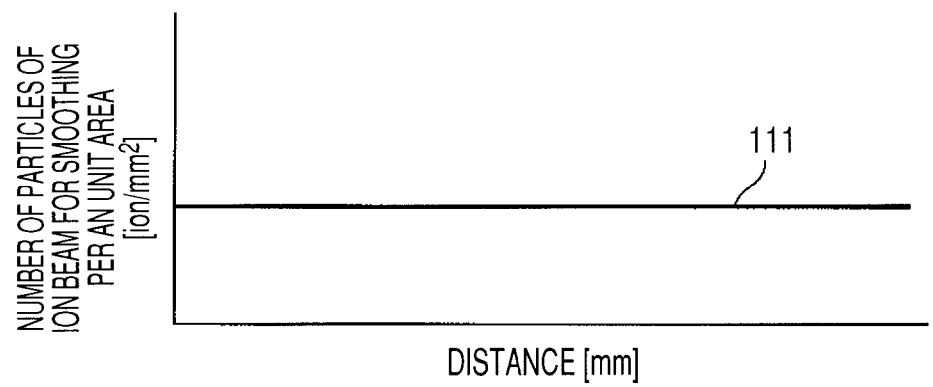

FIGS. 4A, 4B, and 4C are diagrams illustrating a method for making the distribution of the number of particles that reach a unit area in the ion beam for a smoothing process uniform in the present embodiment. FIG. 4A is a graph obtained by converting the residence time distribution of the ion beam for a smoothing process. In FIG. 4A, the horizontal axis indicates time and the vertical axis indicates a variation in scanning speed. In the present embodiment, as shown in FIG. 4B, variable control is performed on the amount 200 of current of the ion beam for a smoothing process. A microwave output controller of the ion beam processing apparatus changes the output of a microwave incident into the plasma chamber to control the amount 200 of current of the ion beam for a smoothing process such that the product of the residence time and the amount 200 of current is constant. In this way, the distribution 111 of the number of particles that reach a unit area in the ion beam for a smoothing process becomes uniform. In this case, the maximum value of the amount 200 of current of the ion beam for a smoothing process is set such that the desired number of particles that reach a unit area is obtained when the residence time is the minimum. In this way, as shown in FIG. 4C, it is possible to make the distribution 111 of the number of particles that reach a unit area in the ion beam for a smoothing process uniform.

In this way, it is possible to simultaneously perform the shape correcting process and the smoothing process in parallel and thus significantly reduce the processing time.

Next, Examples of the method for processing an object using a charged particle beam according to the invention will be described.

EXAMPLE 1

In Example 1, an object was processed by the method according to the first embodiment. A synthetic quartz glass was used as the object. An ion beam for a shape correcting process was used as the first charged particle beam. An ion beam for a smoothing process was used as the second charged particle beam. The ion beam for a shape correcting process and the ion beam for a smoothing process were radiated to the surface of the object at the same time. The ion beam for a shape correcting process and the ion beam for a smoothing process were radiated to the surface of the object at the same time with the raster scan trajectory 103 to scan the surface of the object.

A monovalent argon ion beam having an ion energy of 5 keV and a total ion current of 200 μA was used as the ion beam for a shape correcting process. The ion beam was adjusted by an electromagnetic field lens such that a radiation spot diameter φ on the surface of the object converged to 2 mm. The radiation spot diameter was set such that shape correction was performed in a target space wavelength band. In this way, shape correction was performed in a space wavelength band wider than about 1 mm.

Meanwhile, the ion beam for a smoothing process was adjusted such that the radiation spot diameter cp was 20 mm at an ion energy of 300 eV. When the radiation spot diameter of the ion beam for a smoothing process was set to be more than that of the ion beam for a shape correcting process, it was possible to reliably perform the smoothing process with the ion beam for a smoothing process. In addition, a shutter electrode was attached to the ion beam gun for a smoothing process, and the radiation position was controlled such that the ion beam for a smoothing process was disposed on the rear side of the center of the ion beam for a shape correcting process in the scanning direction (relative movement direction) of the raster scan trajectory. In this way, it was possible to reliably perform the smoothing process with the ion beam for a smoothing process.

First, the shape of the surface of an object was accurately measured by an optical interferometer having a measurement accuracy of a sub-nanometer order, and the measured shape data was used as an object surface shape. A residual shape was calculated from the difference between the object surface shape and the design shape. The residual shape was used as processing shape data. A residence time distribution, which was a beam radiation time at each point, was calculated from the processing shape data, a processing rate of 0.120 $mm^3/h$ when a composite quartz glass was processed with an ion energy of 5 keV and a total current of 200 μA, and the radiation spot diameter. The total amount of current of the ion beam for a shape correcting process was maintained to be constant and the distribution of the number of particles reaching a unit in the ion beam for a shape correcting process was controlled by the residence time distribution. The distribution of the number of particles reaching a unit in the ion beam for a shape correcting process depended on the residual shape. The number of particles reaching a unit was large at a position where the amount of error was large, and the number of particles reaching a unit was small at a position where the amount of error was small. The processing rate calculated from the actual experiment for processing the composite quartz glass was used. In this way, it was possible to correct the shape of a composite quartz glass optical element with high accuracy.

The pulse length of the ion beam for a smoothing process was 1 msec. The ion beam radiation time was changed to a pulse by connecting a high-voltage power supply to the shutter electrode of an ion beam gun for smoothing and applying a high pulse voltage of 10 kV from the high-voltage power supply to the shutter electrode under the control of a control unit of an ion beam processing apparatus.

When the ion beam was changed to a pulse, the radiation time at each point on the surface of the object was the product of a pulse length of 1 msec and the number of pulses. That is, control was performed such that the total amount of current of the ion beam for a smoothing process was maintained to be constant and the number of pulses at each point on the surface of the object was constant. Therefore, control was performed such that the number of particles that reach a unit area was maintained to be constant. That is, control was performed such that, when the scanning speed was high, the number of pulses was large, and when scanning speed was low, the number of pulses was small. As a result, the distribution of the number of particles reaching a unit in the ion beam for a smoothing process was uniform (constant).

The total amount of current of the ion beam for a smoothing process was set such that the desired number of particles reaching a unit was obtained at the highest scanning speed and the largest number of pulses. In this way, it was possible to perform the shape correcting process and the smoothing process at the same time and thus significantly reduce the processing time.

In Example 1, one ion beam for a shape correcting process and one ion beam for a smoothing process were used, but plural ion beams for a shape correcting process and/or plural ion beams for a smoothing process may be used.

EXAMPLE 2

In Example 2, processing was performed by the method according to the second embodiment. Example 2 differs from Example 1 in a method for performing variable control on the ion beam for a smoothing process. The ion beam for a shape correcting process is the same as that in Example 1 and a description thereof will not be repeated.

In Example 2, similar to Example 1, the ion beam for a shape correcting process and the ion beam for a smoothing process were radiated to the surface of a composite quartz glass at the same time and were moved relative to the surface of the composite quartz glass by the same movement. The ion beams passed through the raster scan trajectory by the relative movement.

A monovalent argon ion beam having an ion energy of 5 keV and a total ion current of 200 μA was used as the ion beam for a shape correcting process. The ion beam was adjusted by an electromagnetic field lens such that the radiation spot diameter φ converged to 2 mm. Meanwhile, the ion beam for a smoothing process had an ion energy of 300 eV and a radiation spot diameter φ of 20 mm. In addition, a shutter electrode was attached to an ion beam gun for a smoothing process, and the radiation position was controlled such that the ion beam for a smoothing process was disposed on the rear side of the center of the ion beam for a shape correcting process in the scanning direction of the raster scan trajectory.

In Example 2, an ion source of the ion beam gun for a smoothing process was a microwave type. A microwave output controller of the ion beam processing apparatus could control the output of a microwave incident into a plasma chamber to change plasma density. In this way, it was possible to control the total amount of current of the ion beam.

The number of particles reaching a unit in the ion beam for a shape correcting process was determined by the same method as that in Example 1. First, the shape of the surface of an object was accurately measured, and a residual shape was calculated from the difference between the measured data and the design shape. The residual shape was used as processing shape data. A residence time distribution, which was an ion beam radiation time data at each point, was calculated from the processing shape data, a processing rate of 0.120 $mm^3/h$, and the radiation spot diameter. Variable control was performed on the scanning speed of the ion beam for a shape correcting process based on data of the residence time distribution while radiating the ion beam for a smoothing process and the ion beam for a shape correcting process at the same time. In this way, the shape correcting process was performed.

Then, the microwave output controller of the ion beam processing apparatus changed the output of a microwave incident into the plasma chamber to control the amount 200 of current of the ion beam for a smoothing process such that the product of the residence time and the amount 200 of current was constant. In this way, the distribution of the number of particles reaching a unit in the ion beam for a smoothing process became uniform.

According to Example 2, similar to Example 1, it was possible to simultaneously perform the shape correcting process and the smoothing process in parallel and thus significantly reduce the processing time.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-038814, filed Feb. 23, 2009, which is hereby incorporated by reference herein in its entirety.

What is claimed is:

1. A method for processing an object by radiating a plurality of charged particle beams, comprising:
    radiating a first charged particle beam to an object, while the first charged particle beam and the object are moved relative to each other at a first speed;
    simultaneously radiating a second charged particle beam to the object, while the second charged particle beam and the object are moved relative to each other at the first speed;
    controlling the first speed of the movement of the first charged particle beam and the second charged particle beam to correct the shape of the object with the first charged particle beam; and
    controlling the second charged particle beam according to a variation in the first speed of the movement of the second charged particle beam so as to make a number of particles of the second charged particle beam that reach a unit area of the object constant, thereby smoothing the object.

2. The method for processing an object according to claim 1, further comprising the step of controlling the second charged particle beam to control a pulse of a radiation time.

3. The method for processing an object according to claim 1, further comprising the step of controlling the second charged particle beam to control an amount of current of the second charged particle beam.

4. The method for processing an object according to claim 1, further comprising the step of providing the second charged particle beam with a low energy of 20 to 500 eV.

5. A method for processing an object by radiating a plurality of charged particle beams, comprising:
    radiating a first charged particle beam to the surface of an object, while the first charged particle beam and the object are moved relative to each other at a first speed;
    simultaneously radiating a second charged particle beam to the object, while the second charged particle beam and the object are moved relative to each other at the first speed;
    controlling the first speed of the movement of the first charged particle beam to correct the shape of the surface of the object with the first charged particle beam; and
    controlling the second charged particle beam according to a variation in the first speed of the movement of the second charged particle beam so as to make uniform a number of particles of the second charged particle beam that reach a unit area of the surface of the object, thereby smoothing the object.

6. The method for processing an object according to claim 5, further comprising the step of controlling the second charged particle beam to control a pulse of a radiation time.

7. The method for processing an object according to claim 5, further comprising the step of controlling the second charged particle beam to control an amount of current of the second charged particle beam.

8. The method for processing an object according to claim 5, further comprising the step of providing the second charged particle beam with a low energy of 20 to 500 eV.

* * * * *